United States Patent
Lam

(10) Patent No.: US 8,055,988 B2
(45) Date of Patent: Nov. 8, 2011

(54) MULTI-BIT MEMORY ERROR DETECTION AND CORRECTION SYSTEM AND METHOD

(75) Inventor: Chung Hon Lam, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 1257 days.

(21) Appl. No.: 11/694,025

(22) Filed: Mar. 30, 2007

(65) Prior Publication Data
US 2008/0244370 A1  Oct. 2, 2008

(51) Int. Cl.
*G06F 11/00* (2006.01)
*H03M 13/00* (2006.01)
(52) U.S. Cl. .................................. 714/803; 365/185.03
(58) Field of Classification Search .................. 714/803; 365/185.03
See application file for complete search history.

(56) References Cited

U.S. PATENT DOCUMENTS

| | | | | |
|---|---|---|---|---|
| 4,605,921 A * | 8/1986 | Riddle et al. | ................. | 714/753 |
| 6,282,143 B1 * | 8/2001 | Zhang et al. | ............. | 365/230.05 |
| 6,331,948 B2 * | 12/2001 | Kasai et al. | ............. | 365/185.09 |
| 6,694,473 B1 * | 2/2004 | Su et al. | ........................ | 714/755 |
| 7,480,184 B2 * | 1/2009 | Lam | ........................ | 365/185.24 |

OTHER PUBLICATIONS

LAM; Maximum Likelihood Statistical Method of Operations for Multi-Bit Semiconductor Memory; Unpublished U.S. Appl. No. 11/620,704, filed Jan. 7, 2007.

* cited by examiner

*Primary Examiner* — Guy Lamarre
(74) *Attorney, Agent, or Firm* — Tutunjian & Bitetto, P.C.; Vazken Alexanian

(57) ABSTRACT

A system and method for operating a collection of memory cells includes storing binary data values and parity data values by associating binary values with a common adjustable characteristic parameter of a memory cell collection. Probability distribution functions for values of the characteristic parameter of the memory cell collection are read and constructed. Binary data values and parity data values stored in the memory cell collection are retrieved. Parity data for error detection and error correction is evaluated in the binary data values.

19 Claims, 10 Drawing Sheets

| Data Cell 1 | 0 | 0 | 1 |
|---|---|---|---|
| Data Cell 2 | 1 | 1 | 1 |
| Data Cell 3 | 0 | 0 | 0 |
| Data Cell 4 | 1 | 0 | 1 |
| Data Cell 5 | 1 | 0 | 0 |
| Data Cell 6 | 1 | 1 | 1 |
| Data Cell 7 | 0 | 1 | 0 |
| Data Cell 8 | 1 | 1 | 0 |
| Parity Cell | 1 | 0 | 0 |
| Parity | 0 | 0 | 0 |
FIG. 8A
| Retrieved Data | | Probability |
|---|---|---|
| Data Cell 1 | 0 0 1 | 0.290 |
| Data Cell 2 | 1 1 0 | 0.047 |
| Data Cell 3 | 0 0 0 | 0.974 |
| Data Cell 4 | 1 0 1 | 0.599 |
| Data Cell 5 | 1 0 0 | 0.455 |
| Data Cell 6 | 1 1 1 | 0.561 |
| Data Cell 7 | 0 1 0 | 0.878 |
| Data Cell 8 | 1 1 0 | 0.792 |
| ParityCell | 1 0 0 | 0.924 |
| Parity | 0 0 1 | |
FIG. 8B
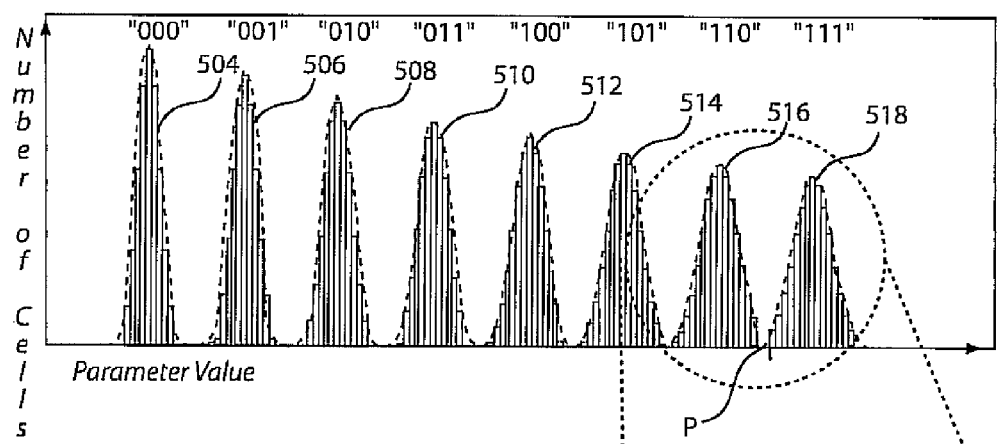
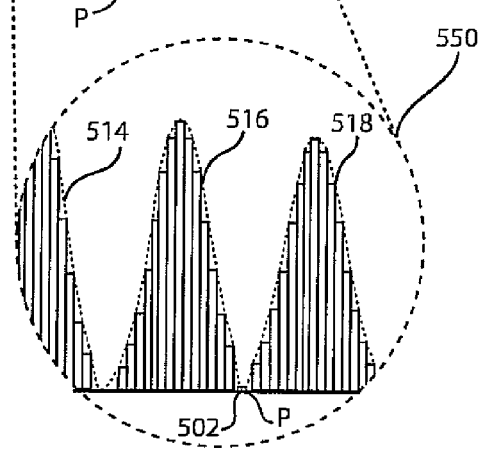
FIG. 9

MULTI-BIT MEMORY ERROR DETECTION AND CORRECTION SYSTEM AND METHOD

BACKGROUND

1. Technical Field

The present invention relates to error detection and correction in memory storage systems and more particularly to efficient systems and methods for error detection and correction using statistical methods in high density storage systems.

2. Description of the Related Art

Typical semiconductor computer memories are fabricated on semiconductor substrates consisting of arrays of a large number of physical memory cells. In general, one bit of binary data is represented as a variation of a physical parameter associated with a memory cell. Commonly used physical parameters include threshold voltage variations of Metal Oxide Field Effect Transistors (MOSFET) due to the amount of charge stored in a floating gate or a trap layer in non-volatile Electrically Erasable Programmable Read Only Memory (EEPROM), resistance variation of the Phase Change memory element in Phase-change Random Access Memory (PRAM) or Ovonic Unified Memory (OUM), charge storage variation of the capacitor in volatile Dynamic Random Access Memory (DRAM) and reflectivity variation of Phase Change material on a Compact Disc Read Only Memory (CDROM).

Costs of memory storage systems are strictly dependent on the amount of information that can be stored in a given area of a semiconductor substrate or storage media. Aside from minimizing the area of each physical memory cell by decreasing the critical dimension of the manufacturing process, one cost effective technique to increase the information storage in a memory storage system is to increase the amount of information that can be stored in each physical memory cell in the storage system.

Increasing the number of bits to be stored in a single physical memory cell is an effective method for lowering manufacturing costs per bit. Multiple bits of data can be stored in a single memory cell when variations of the physical parameter can be associated with multiple bit values. This multiple bit storage memory cell is known as a Multi-Level Cell (MLC). A significant amount of effort in memory device and circuit designs is devoted to maximize the number of bits to be stored in a single physical memory cell. This is particularly true with storage class memory such as popular non-volatile Flash memories commonly used as mass storage devices.

The basic requirement for multiple bit storage in a memory cell is to have the spectrum of the physical parameter variation to accommodate multiple non-overlapping bands of values. The number of bands required for an n-bit cell, for example, is $2^n$. A 2-bit cell needs 4 bands, a 3-bit cell needs 8 bands and so forth. Thus, the available spectrum of a physical parameter in a memory cell is the limiting factor for multiple bit memory storage.

In addition to limiting spectrum width, fluctuations in environmental variables such as temperature, power and time affect all operations and data integrity of a typical storage device. Data integrity is a major problem for data storage systems due to the fluctuations in environmental variables. It is desirable to devise a cost effective method to preserve the integrity of the stored data in semiconductor storage systems.

Referring to FIG. 1, a storage system 10 is subject to variations in environment 22 such as temperature, power and storage time which may cause variations and decay in the values data 12 through memory processes such as programming 14, storage 16 and reading 18 thus further limiting the information storage of retrieved data 20.

Data 12 to be stored is acquired. The data 12 may come from various sources, such as a Central Processing Unit (CPU) or a peripheral device coupled to a memory unit with the memory cell. The programming operation 14 writes acquired data 12 into the memory cell. Depending on the storage technology used, writing data may include storing charge in a capacitor for charge storage, applying voltage to the source, drain, or control gate in a floating gate transistor for threshold voltage variation, etc. After the data is written into memory, it is stored for a period of time at storing operation 16. At some time in the future, the data is retrieved from the memory cell during a reading operation 18. The data is finally retrieved at operation 20.

As illustrated, the environment 22 (both internal and external to the memory cell) affects the programming 14, storage 16, and reading 18 of the data. Environmental factors such as, but not limited to, humidity, time, temperature, magnetic fields, and electrical fields may cause charge leakage or change resistance levels in memory. More generally, the characteristic parameter used to delineate binary values in the memory cell may shift over time due to environmental conditions. The environmental factors 22 cause data distortion so that the data 20 extracted from the memory cell may not be the same as the data 12 input to the memory cell.

While defective bits which are usually caused by imperfections in manufacturing can generally be identified by reliability test procedures and be replaced with redundant bits in high density memory, normal statistical fluctuations of the physical parameter will result in natural dispersion of the values of the physical parameter which cannot be identified with test procedures. To guard against this intrinsic dispersion of the physical parameter values, wide bands of the parameter values are used in the prior art to represent each binary bit to be stored in the memory cells to assure data integrity. This band structure used in the prior art is illustrated in FIG. 2A and FIG. 2B.

Referring to FIG. 2A, a number of memory cells (y-axis) versus parameter values (P) (x-axis) for data stored is plotted to provide probability distributions. The probability distributions in FIG. 2A show wide bands of the parameter values used to represent binary information stored in the memory cells to assure data integrity. FIG. 2A includes bands from $P_{min}$ to $P_{ref1}$, $P_{ref1}$ to $P_{ref2}$, $P_{ref2}$ to $P_{ref3}$ and $P_{ref3}$ to $P_{max}$.

Referring to FIG. 2B, the parameter values are subject to dispersion as illustratively shown. To guard against this dispersion of the parameter values, the bands are made wide enough to retain dispersed distributions within the respective bands assuring data integrity as depicted in FIG. 2B. As illustrated in FIG. 2A and FIG. 2B, the prior art is not using the available bandwidth efficiently. In order to accommodate the natural statistical dispersions of the memory cell distributions within the respective bands of the characteristic parameter, the bands are designed to be relatively wide with respect to the dispersions. Therefore auxiliary systems and methods are needed to increase the information capacity of a storage device with memory cells of a given characteristic parameter bandwidth.

SUMMARY

A system and method for error correction in a collection of memory cells wherein each memory cell stores one or more bits of binary data associated with a characteristic parameter of the memory cells includes dividing the said collection of memory cells in groups wherein a parity cell is added to each group, writing all the memory cells in the collection memory cells including the parity memory cells at about the same time, subsequently sensing a high precision value of the characteristic parameter for each memory cell in the collection and constructing probability distribution functions for the characteristic parameter from the collection of high precision characteristic parameter values. Binary data for a target memory cell in the collection of memory cells is retrieved by evaluating the probabilities with the characteristic parameter of the target memory cell in the probability distribution functions obtained above, selecting the distribution with the highest probability and associating the binary value with the selected distribution. Parity data associated with each group of memory cells is evaluated to determine if an error or errors exist in the group. An erroneous memory cell is identified by comparing the probability values of all the memory cells including the parity memory cell in their respective distributions and choosing the most probable one memory cell in the group with the lowest probability value with the probable bias to an adjacent distribution. The error memory cell is then corrected by associating the value of its characteristic parameter to a nearest neighboring probability distribution.

A system and method for operating a collection of memory cells includes storing binary data values and parity data values by associating binary values with a common adjustable characteristic parameter of a memory cell collection. Probability distribution functions for values of the characteristic parameter of the memory cell collection are read and constructed. Binary data values and parity data values stored in the memory cell collection are retrieved. Parity data for error detection and error correction is then evaluated in the binary data values.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein:

FIG. 8A shows a table with eight memory cells and a parity cell for the group of eight memory cells;

FIG. 8B shows a table with probabilities calculated for each memory cell being associated with associated probability distributions;

FIG. 9 is a diagram showing a collection of memory cells where a single cell error is identified using the parity information and the cell distribution probability associated with the characteristic parameter shown in FIG. 8B.

DETAILED DESCRIPTION OF PREFERRED EMBODIMENTS

Figure 1:
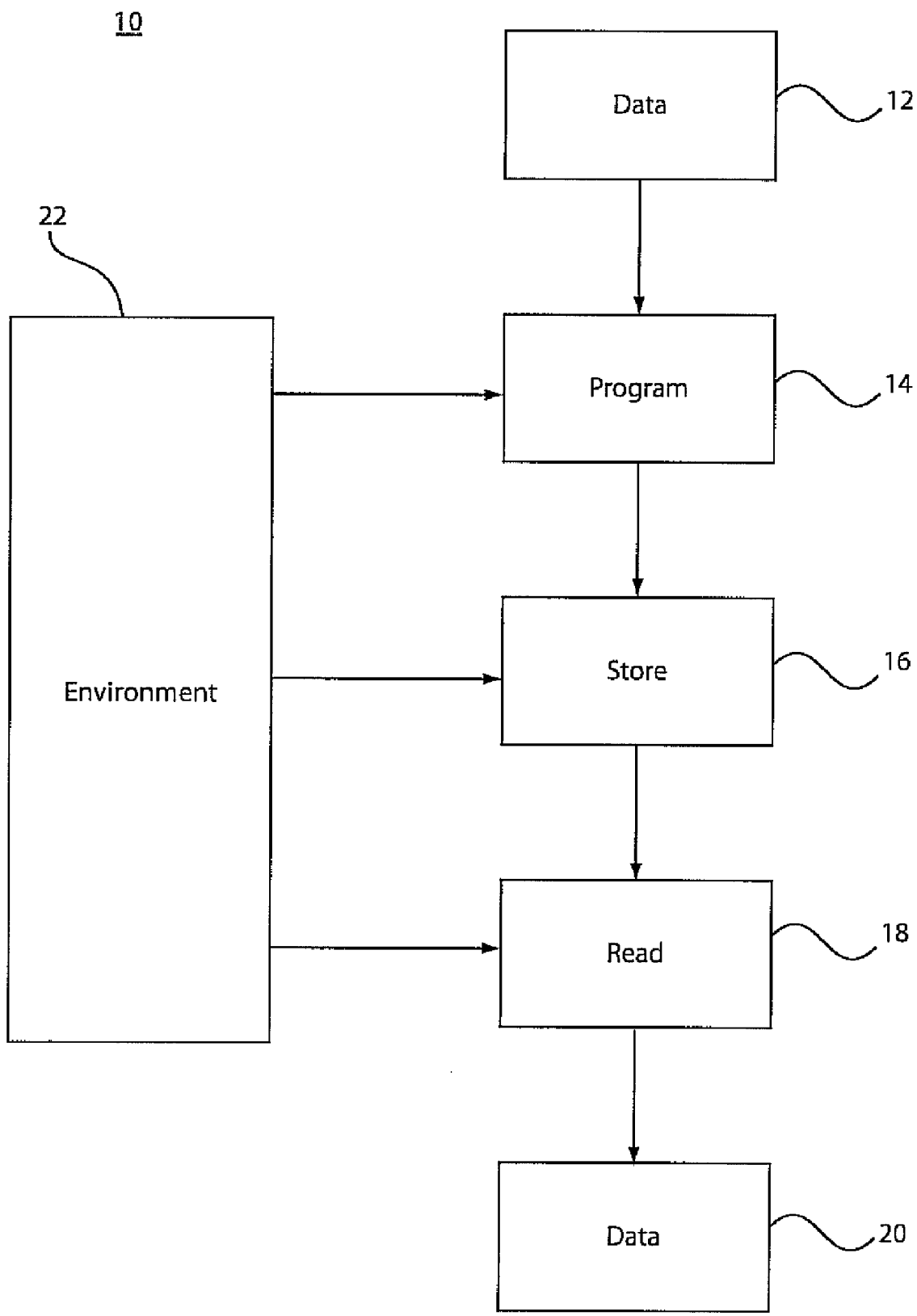
FIG. 1 is a block diagram showing environmental influences on data operations.
Figure 2A:
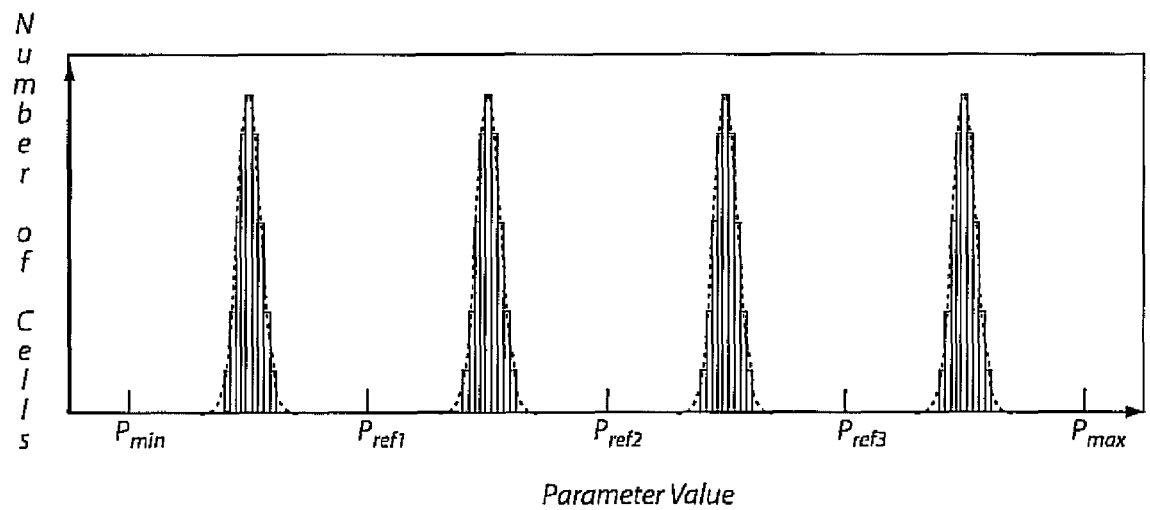
FIG. 2A is a diagram showing an initial probability distribution functions for characteristic values stored in memory in accordance with the prior art.
Figure 2B:
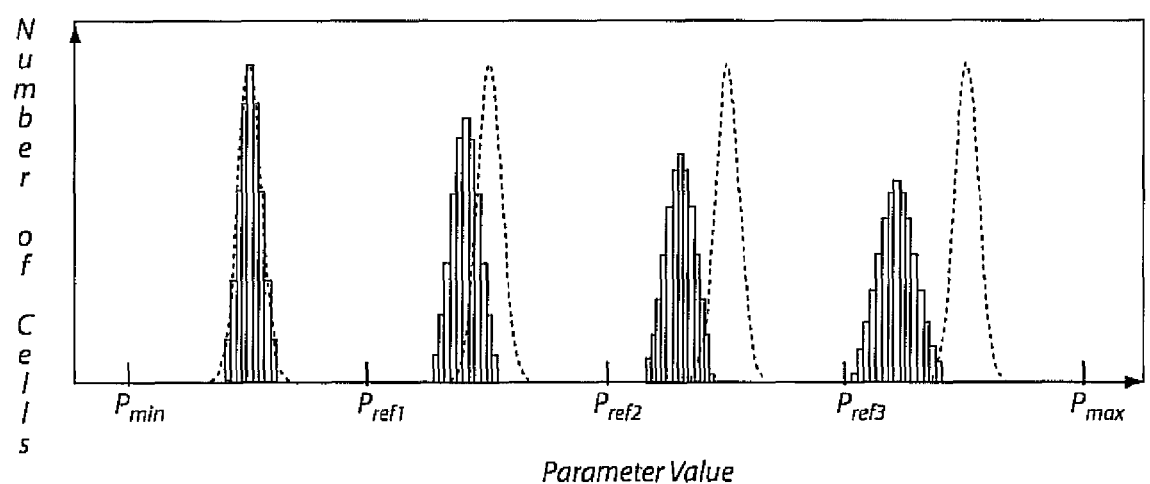
FIG. 2B is a diagram showing shifted probability distribution functions for characteristic values stored in memory due to environmental conditions in accordance with the prior art.

In a memory system in which defective and anomalous memory cells are eliminated with functional and reliability tests, errors due to normal statistical fluctuations of the values of the characteristic parameter or of natural wear-out of memory cells may still occur. These may occur particularly in multi-bit memory systems when bands of characteristic parameter values representing multiple binary values are packed tight together to maximize the storage density of the memory system. These errors can be corrected by applying Error Correction Codes (ECC). Multi-bit systems may also mean multi-level systems having different levels of values.

In accordance with present principles, an efficient error detection and error correction system and method are devised using only a single parity bit to each group of a memory cell collection in combination with statistical operations of the data during a read operation.

The present principles provide an error detection and correction system and method to maximize the amount of information that can be stored in a memory storage system using multi-level memory cells. The error detection and correction scheme is designed to find and correct errors due to intrinsic statistical dispersion of parameter values when the bands of the parameter value are minimized to increase information storage of each memory cell. Additional information on the present principles can be found in a commonly assigned disclosure entitled "MAXIMUM LIKELIHOOD STATISTICAL METHOD OF OPERATIONS FOR MULTI-BIT SEMICONDUCTOR MEMORY", Ser. No. 11/620,704, filed Jan. 7, 2007, and incorporated herein by reference.

Embodiments of the present invention can take the form of an entirely hardware embodiment, an entirely software embodiment or an embodiment including both hardware and software elements. In a preferred embodiment, the present invention is implemented in hardware but may also employ software, which includes but is not limited to firmware, resident software, microcode, etc.

Furthermore, the invention can take the form of a computer program product accessible from a computer-usable or computer-readable medium providing program code for use by or in connection with a computer or any instruction execution system, for example, in a memory controller. For the purposes of this description, a computer-usable or computer readable medium can be any apparatus that may include, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code may include at least one processor or controller coupled directly or indirectly to memory elements through a system bus. The memory elements can include local memory employed during actual execution of the program code, bulk storage, and cache memories which provide temporary storage of at least some program code to reduce the number of times code is retrieved from bulk storage during execution. Input/output or I/O devices (including but not limited to keyboards, displays, pointing devices, etc.) may be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

Present embodiments may be part of the design and/or testing for integrated circuit chips. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., Graphic Data System II (GD-SII)) for the fabrication of photolithographic masks, which typically include multiple copies of the chip design in question that are to be formed on a wafer. The photolithographic masks are utilized to define areas of the wafer (and/or the layers thereon) to be etched or otherwise processed. The method as described above is used in the fabrication of integrated circuit chips.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 3:
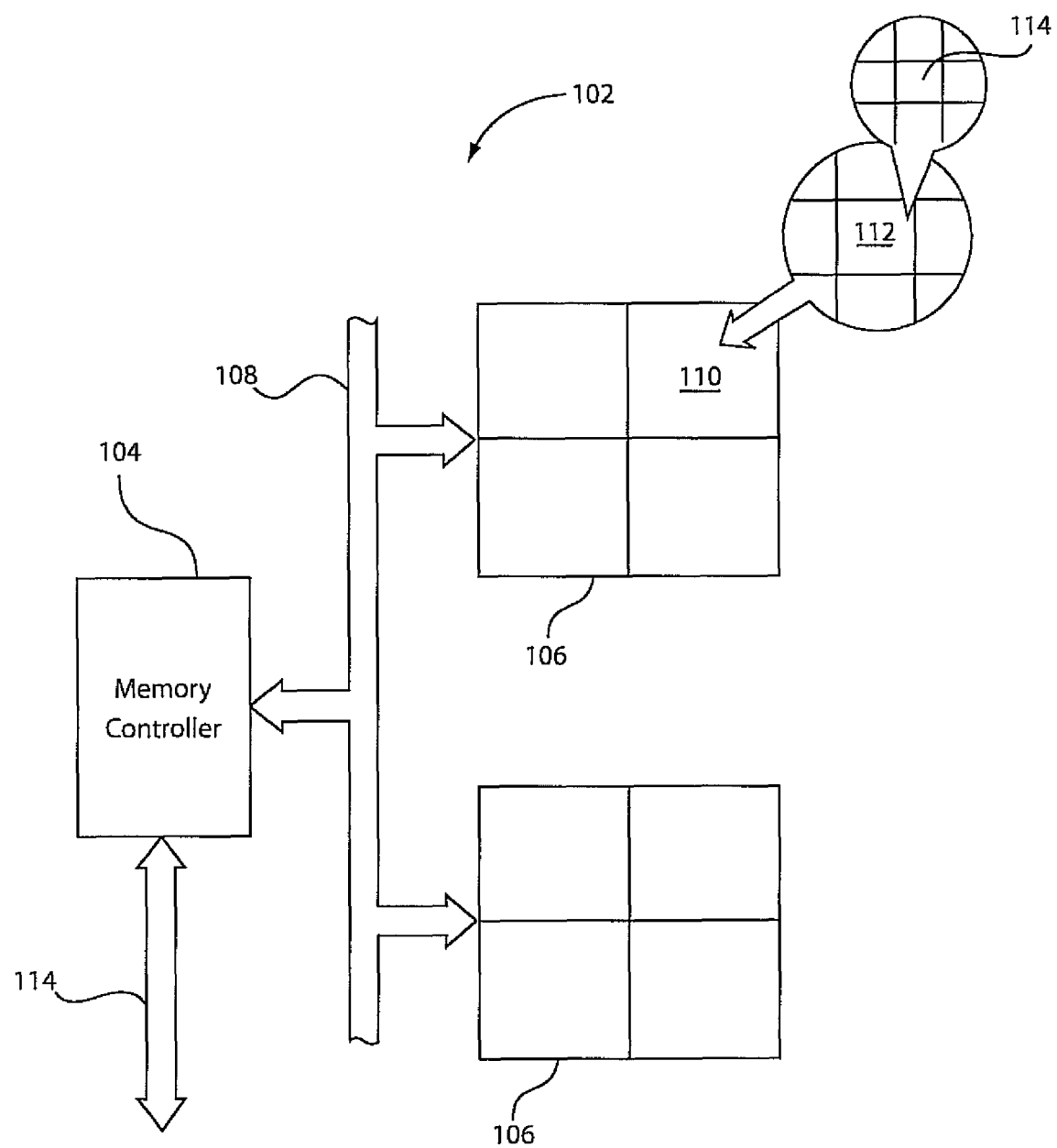
FIG. 3 illustrates an exemplary embodiment for a system operating a plurality of memory cells, memory cell collections, and memory units.

Referring now to the drawings in which like numerals represent the same or similar elements and initially to FIG. 3, an exemplary embodiment for a system 102 contemplated by the present principles is illustratively depicted. The system 102 includes a memory controller 104 coupled to one or more memory units 106 via a memory bus 108. The memory units 106 may be individually packaged memory chips. Alternatively, the memory units 106 may exist in a single package and multiplexed together. Furthermore, the memory controller 104 may be separately packaged or incorporated with the memory units 106.

The memory units 106 are not limited to a particular memory storage technology. Those skilled in the art will recognize that different memory technologies use different characteristic parameters to store data. For example, Random Access Memory (DRAM) technology uses charge storage variation as a characteristic parameter to retain binary data. Flash Electrically Erasable Programmable Read Only Memory (EEPROM) uses apparent threshold voltage variations due to charge stored in the floating gate as a characteristic parameter to differentiate binary data. Phase Change Memory (PCM) and Resistive Random Access Memory (RRAM) technologies use resistance variation as a characteristic parameter to store binary data. Optical Compact Disk Read Only Memory (CDROM) including re-writable CDROM uses reflectivity index as a characteristic parameter to encode binary data.

As shown, each memory unit 106 is divided into a plurality of memory cell collections 110. Each memory cell collection 110 is further sub-divided into a plurality of memory cell groups 112. Each memory cell group 112 is comprised of a plurality of memory cells 114. Each individual memory cell 114 stores one possible binary value by associating the binary value with a band of the characteristic parameter of the memory cell. The bands are delimited by preset value ranges of a characteristic parameter during the store operation. For proper performance of the present error detection and correction scheme, the memory cells 114 within a memory cell collection 110 are physically located in proximity with each other, are written and read at about the same time, and therefore undergo similar characteristic parameter perturbation and deterioration.

In one embodiment, the memory controller 104 receives a command and the corresponding data from the central processing unit (CPU) through the instruction/data bus 116 to program a memory cell collection 110. Upon receiving the data, the memory controller 104 sub-divides the data into groups, calculates and tags each group with a parity cell before sending the data to the memory cell collection 110 to be programmed.

Figures 4A, 4B, 4C:
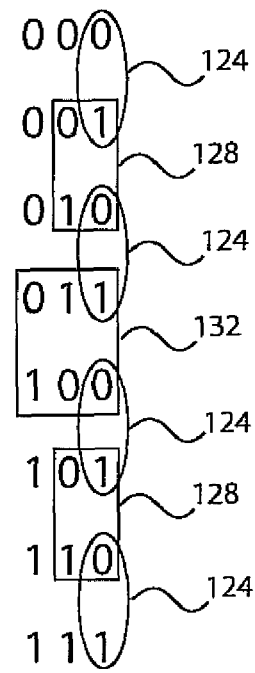
FIG. 4A is a table showing data for a group of memory cells with parity memory cells included therewith and data stored in the memory cells.
FIG. 4B shows a table of bands and an illustrative parity validity check in accordance with one embodiment.
FIG. 4C shows a table with results of the parity cell check along with the parity information for the collection in accordance with one embodiment.

FIG. 4A shows an illustrative storage table for a memory cell group 112 of 8 data cells 114 and a corresponding parity cell 118 along with a parity check value 122 for an even parity coding scheme. The data bits of the parity cell 118 data are obtained by evaluating each column 120 of the data bits comprising the data cells 114 and the parity cell 118 to an even binary. Only the least significant bits for each column are retained and shown in the parity check value 122. It should be noted that other parity schemes may be employed as well.

Recalling the fact that a memory system in which defective and anomalous memory cells can be eliminated with functional and reliability tests, characteristic parameter values in the memory cells decay according to the physics associated with the parameter as functions of the environmental variables and statistically within specification tolerances. Taking advantage of this, the present invention teaches an error detection and correction scheme to maximize the amount stored in a storage device without compromise to data reliability. The system detects errors within overlaps among neighboring distributions which are particularly inevitable at very low probability values in tightly packed memory cell distributions for multi-level memory cell storage devices.

Memory cells with statistical deviation from the normal decay rate can also contribute to distribution overlaps.

Figure 5:
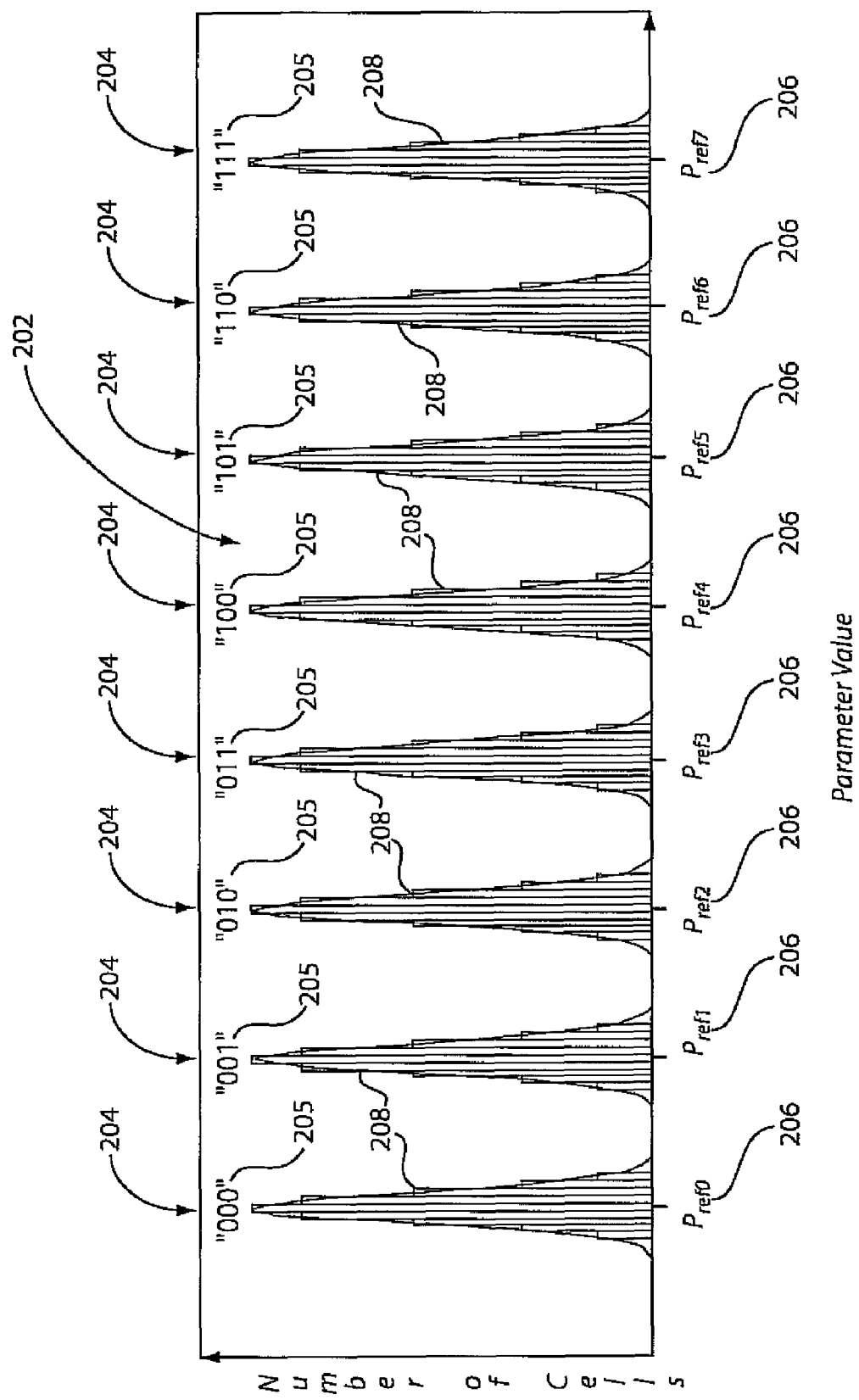
FIG. 5 is a diagram showing a collection of memory cells storing three bits each where a characteristic parameter is centered at a reference value which represents a binary value.

The present invention also detects non-correctable errors, such as one due to anomalous wear out in the field for example. Unlike correctable errors described above, a non-correctable error can render the parameter value of data stored in a defective memory cell to straddle over multiple bands of parameter values since non-correctable errors are not due to natural decay, normal manufacturing processes and operating variations. Again, for a memory cell collection where each bit stores 3 bits and the binary values are arranged in bands in the order as shown in FIG. 5 across the memory cell parameter bandwidth, correctable errors are identified by analyzing the band information in FIG. 4B. Each row in FIGS. 4B and 4C represents the binary information associated with the reference bands.

FIG. 4C shows the 8 possible parity check values for the 3-bit storage memory cell collection are grouped into 2 categories as "correctable" and "non-correctable" errors. There is no detected error when the parity check value is evaluated to "000" as shown in FIG. 4C.

For the correctable error 126, there are 4 possible locations for the occurrence of an error as depicted in circled areas 124 of FIG. 4B. These occurrences are due to possible shifting associated with neighboring memory cell distributions when only the right most bit of the parity check value 126 indicates a correctable error in FIG. 4C.

There are 2 possible error locations shown as 128 depicted in FIG. 4B associated with neighboring memory cell distributions when the right two bits of the parity check value are "1" as shown in 123, which indicates another correctable error in FIG. 4C.

The third correctable error indicated by 132 in FIG. 4B is associated with neighboring memory cells distributions when all 3 bits of the parity check values are evaluated to "1" as shown by 134 in FIG. 4C. The rest of the parity check values indicate detection of non-correctable errors. The parity values that are correctable are so since they are related to mis-grouping of memory cells into an incorrect distribution. Other defects may be handled by rewriting data from a redundant source as described earlier.

Referring to FIG. 5, a distribution of a memory cell collection 202 with each memory cell storing 3 bits immediately after a programming operation in a storage system is illustratively shown where 8 non-overlapping distributions 208 superimpose on each other over the bandwidth of characteristic parameter of the memory cells. A characteristic parameter value 206 (e.g., designated as parameters $P_{ref0}$-$P_{ref7}$) for each binary value 204 is employed as reference during the programming operation when each memory cell is programmed to center the characteristic parameter value 206 corresponding to the binary data 204 being stored. All the memory cells in the memory cell collection 202 are programmed at about the same time typically in a sequential manner based on the logical addresses of the memory cells presented to the memory cell array.

Ideally, binary values stored in the memory cell collection 202 are represented by precise characteristic parameter values centered at the characteristic parameter values. In practice, however, the characteristic parameter values form value ranges (typically Gaussian distribution curves) centered about the initial reference points. This is typically due to natural variations during memory cell manufacturing. Thus, the initial reference points ($P_{ref0}$-$P_{ref7}$) are mean values of the characteristic parameter when data is initially programmed in a memory cell collection. Furthermore, the characteristic parameter values shift as a result of environmental factors over time, as discussed above Distributions 208 of each collection 202 are uniform initially and centered on the reference parameters $P_{ref0}$-$P_{ref7}$. Without loss of generality, the number of cells 204 in each band is assumed to be the same here; however, the numbers of cells may vary.

Figure 6:
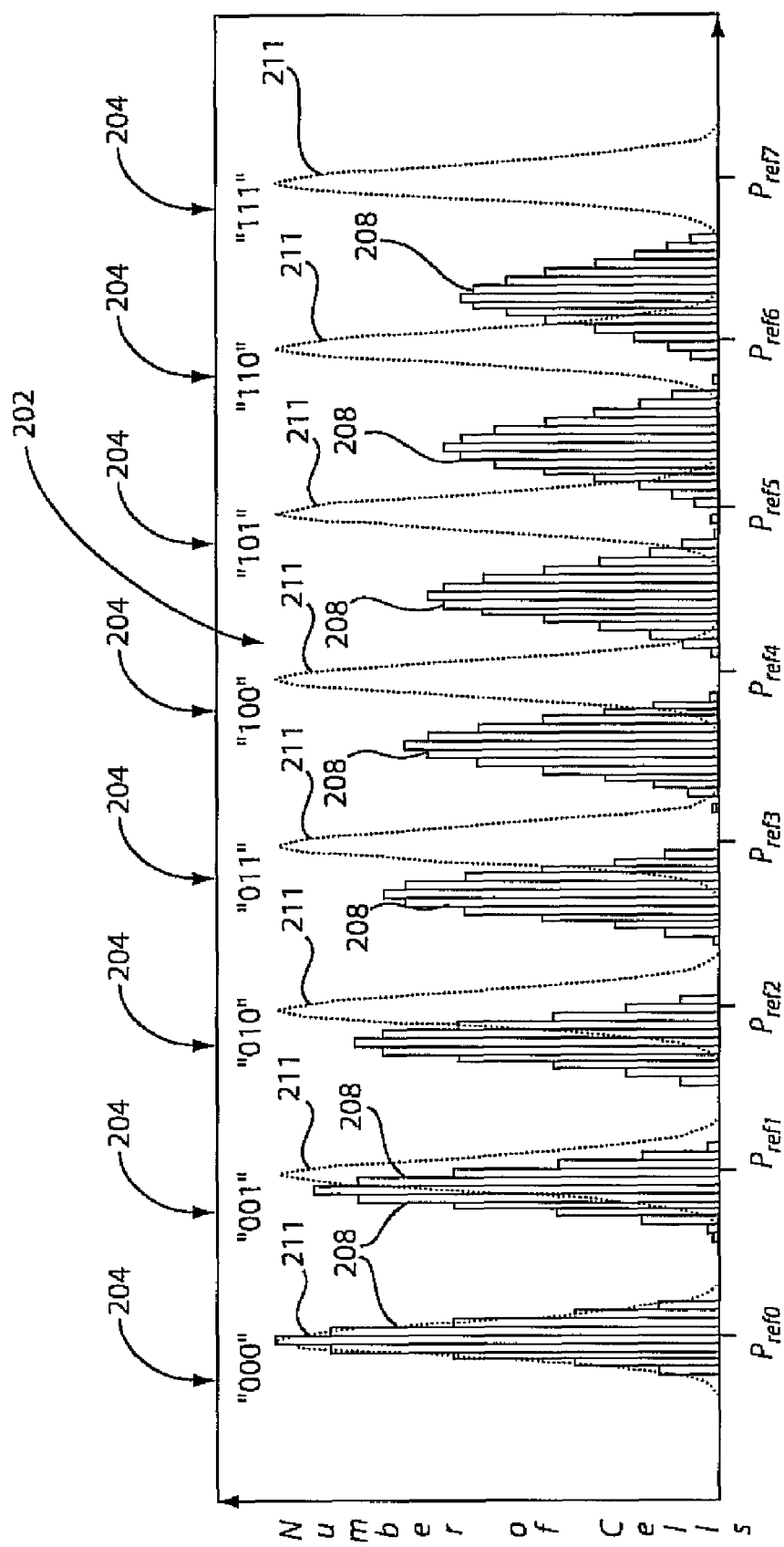
FIG. 6 is a diagram showing the collection of memory cells of FIG. 5 after decay.

Referring to FIG. 6, decay of the parameter values of the memory cell collection 202 programmed at about the same time is illustratively depicted. The distributions 208 are shifted towards the left from their original positions 210 which represent a lower potential energy configuration of the memory cell parameter within the storage or operating environment. In general, the shift is more pronounced and the dispersion is wider farther away from the lowest potential energy configuration. For example, the characteristic parameter in FIG. 6 may represent the apparent threshold voltages of a memory cell collection of Flash EEPROM in which the apparent threshold voltage is an increasing function of the number of electrons stored in the floating gate, and the lowest potential energy configuration is no electron stored corresponding to lowest apparent threshold voltage.

The memory controller 104 (FIG. 3) beneficially compensates for decays in characteristic parameter values by not only reading the characteristic parameter value of a target memory cell in the memory cell collection 202, but also of the characteristic parameter values of all the memory cells in the memory cell collection 202. In the data retrieval operation, the memory controller 104 receives a high precision characteristic parameter value for each memory cell in the memory cell collection 202 and fits the dispersed and shifted histograms 208 with probable distribution curves (310, FIG. 7) by statistical methods as illustrated in FIG. 7.

Figure 7:
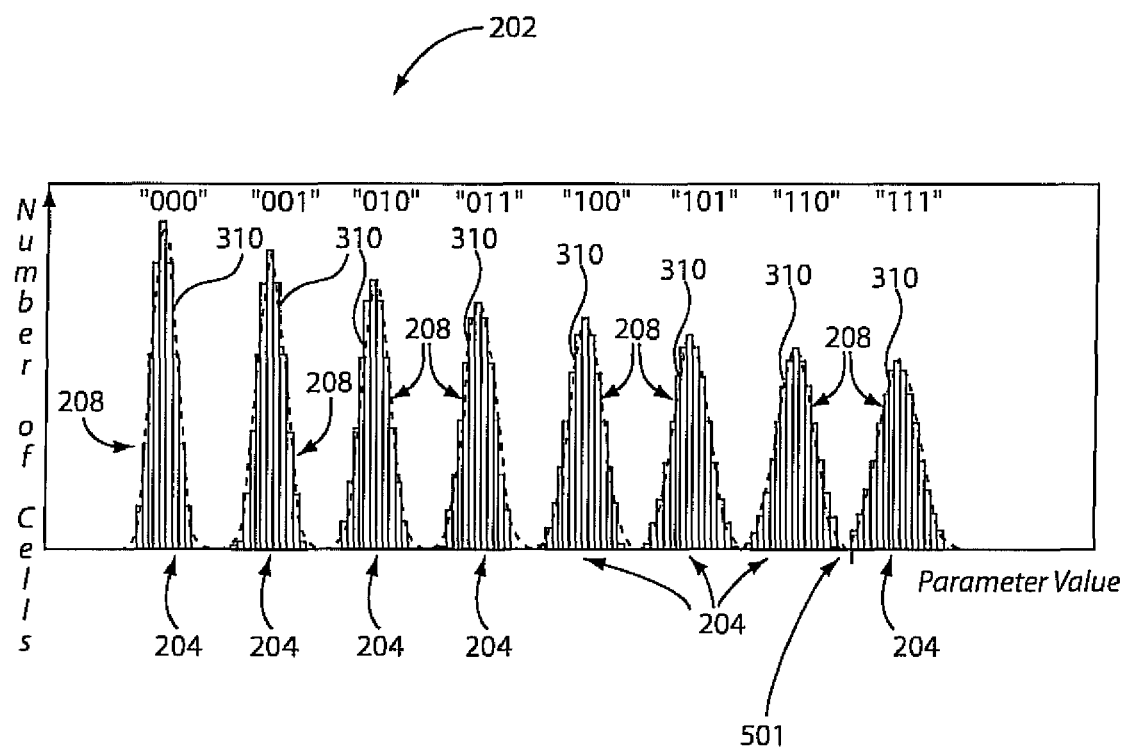
FIG. 7 is a diagram showing a collection of memory cells where an error cell occurs between two distributions.

Referring to FIG. 7, the characteristic parameter value of a target cell is evaluated against the shifted characteristic parameter distribution curves 310 constructed and the most likely binary value for the target memory cell is determined by choosing the distribution with the highest probability value. Any memory cell in the memory cell collection 202 can be a target cell. In this manner, the binary values of all the memory cells in the collection of memory cells 202 can be retrieved. The characteristic parameter curves 310 of the memory cell collection 202 are reconstructed each time the target memory cell or a subset of the memory cell collection 202 or the entire memory cell collection 202 is read. This may include that the data is rewritten or restored after a threshold time interval and/or when a memory cell is programmed or reprogrammed.

In one embodiment, the characteristic parameter curves are created by a probability distribution function, $$P(x_1^k, \ldots, x_{n_k}^k | \mu_k, \sigma_k^2) = \left(\frac{1}{2\pi\sigma_k^2}\right)^{\frac{n_k}{2}} e^{\frac{\sum_{i=1}^{n_k} (x_1^k - \overline{x^k})^2 + n_k(\overline{x^k} - \mu_k)^2}{2\sigma_k^2}}$$

where $n_k$ is the number of memory cells with a characteristic parameter in the kth value range, m is the number of bit storage values per memory cell, and $x^k$ is the value of the characteristic parameter value read from a memory cell pertaining to a specific curve, not x to the kth power; so, $x_1^1$, would indicate the first characteristic parameter from the first characteristic parameter value range in the memory cell collection. The number of value ranges/curves (k) and the mean of the characteristic parameter values read ($\overline{x^k}$) are defined by, $$k = 1, \ldots, 2^m, \overline{x^k} = \frac{1}{n_k} \sum_{i=1}^{n_k} x_i^k.$$

Additionally, $\mu_k$ is the mean of the kth value range, also used as the reference points $P_{ref}$ and $\sigma_k^2$ is the variance of the kth value range.

A maximum likelihood estimator is given by, $$\hat{\theta}_k = (\hat{\mu}_k, \hat{\sigma}_k^2) = \left(\overline{x^k}, \sum_{i=1}^{n_k} (x_i^k - \overline{x^k})^2 / n_k\right)$$

where $\hat{\mu}_k$ is the mean estimator of the kth value range and $\hat{\sigma}_k^2$ is the variance estimator of the kth value range. The maximum likelihood estimator is used to determine the value range to which a particular value belongs, and in turn the binary data a memory cell includes, by using a least squares method. A sensed value from the memory cell is placed in each individual value range of the memory cell collection and a probability is assigned to each value range based on the value and its relation to the mean of the value range.

Dashed distribution curves 310 in FIG. 7 can be obtained by using the best fits of the data cell distributions over the entire readable parameter space obtained using maximum likelihood estimation, as described above.

A problem in constructing shifted distribution curves arises if each individual memory cell is programmed separately. The shifts of each characteristic parameter will vary since each memory cell may be exposed to environmental factors over different durations of time between programming. For example, in EEPROM, the electrons stored in the floating gate may leak over time and with heat. Memory cells programmed at differing times will have differing amounts of electron leakage depending on the how long they have been exposed to heat since their initial programming. Furthermore, the characteristic parameter curves will differ greatly from collection of memory cells to collection of memory cells.

If the cells are programmed all at the same time whether or not certain data needs to be changed creates a consistent data shift. This prevents the aforementioned problem with varying degrees of shift because electron leakage is consistent across a collection of memory cells. New distribution curves can now be created with consistently shifted data using the probability distribution function and the maximum likelihood estimator.

Since time, heat, and other environmental factors shift characteristic parameter values and their ranges, over a period of time the value ranges may shift enough so that they may become one continuous curve.

Referring to again FIG. 7, for example, the shifted value ranges 310 corresponding to binary data "110" and "111" begin to overlap at point 501. A maximum likelihood estimator can be used to generate a good estimate for values located in an overlapping region, but as overlap increases the accuracy of the maximum likelihood estimator also decreases.

By way of the following example, the error detection and correction scheme will be illustrated. Referring to the forementioned memory cell collection wherein each memory cell stores 3 bits of data, FIG. 8A depicts the binary data stored in a memory cell group of 8 memory cells along with the corresponding parity memory cell 410 coded to even parity "000" 412. During a subsequent read operation, the retrieved data of the memory cells group depicted in FIG. 8A is shown in FIG. 8B. The parity 412 evaluated from the retrieved data is "001" as shown in FIG. 8B which indicates an error has been detected (data cell 2 now reads "110"). Along with the binary data retrieved from each memory cell and the parity cell 410 in the memory cells group, a probability value 414 indicating the likeliness that the data retrieved is stored in each memory cell during the programming operation. The probability value 414 for each memory cell is evaluated using statistical methods as discussed above. Comparing the probabilities of in FIG. 8B, the retrieved data "110" for Data Cell 2 has the lowest probability of being correct in the memory cells group, thus is the most probable error memory cell.

Referring to FIG. 9, an illustrative depiction of the occurrence of the retrieved data of Data Cell 2 in FIG. 5B is shown. In FIG. 9, a characteristic parameter value p of Data Cell 2 is indicated as 502. Using the distribution curves 504, 506, 508, 510, 512, 514, 516 and 518, parameter values p evaluate to have the highest probability for error in the distribution curve 516 belonging to the population of memory cells associated with the binary value "110". The association of Data Cell 2 with binary value "110" is likely incorrect in accordance with the calculated probabilities. Compared to the probability values evaluated with the rest of the distribution curves, the probability value of 0.047 for distribution curve 516 is the lowest among the memory cell group to which Data Cell 2 belongs. The probable error is exemplified in zoomed insert 550 where the Data Cell 2 502 with retrieved characteristic value of p straddles across the boundaries of distributions 516 and 518.

A corrective action is taken by assigning Data Cell 2 to the distribution 518 to make Data Cell 2 a member of the population of memory cells associated with the binary value "111" and thus equating the parity check bits in to the correct even values.

Figure 10:
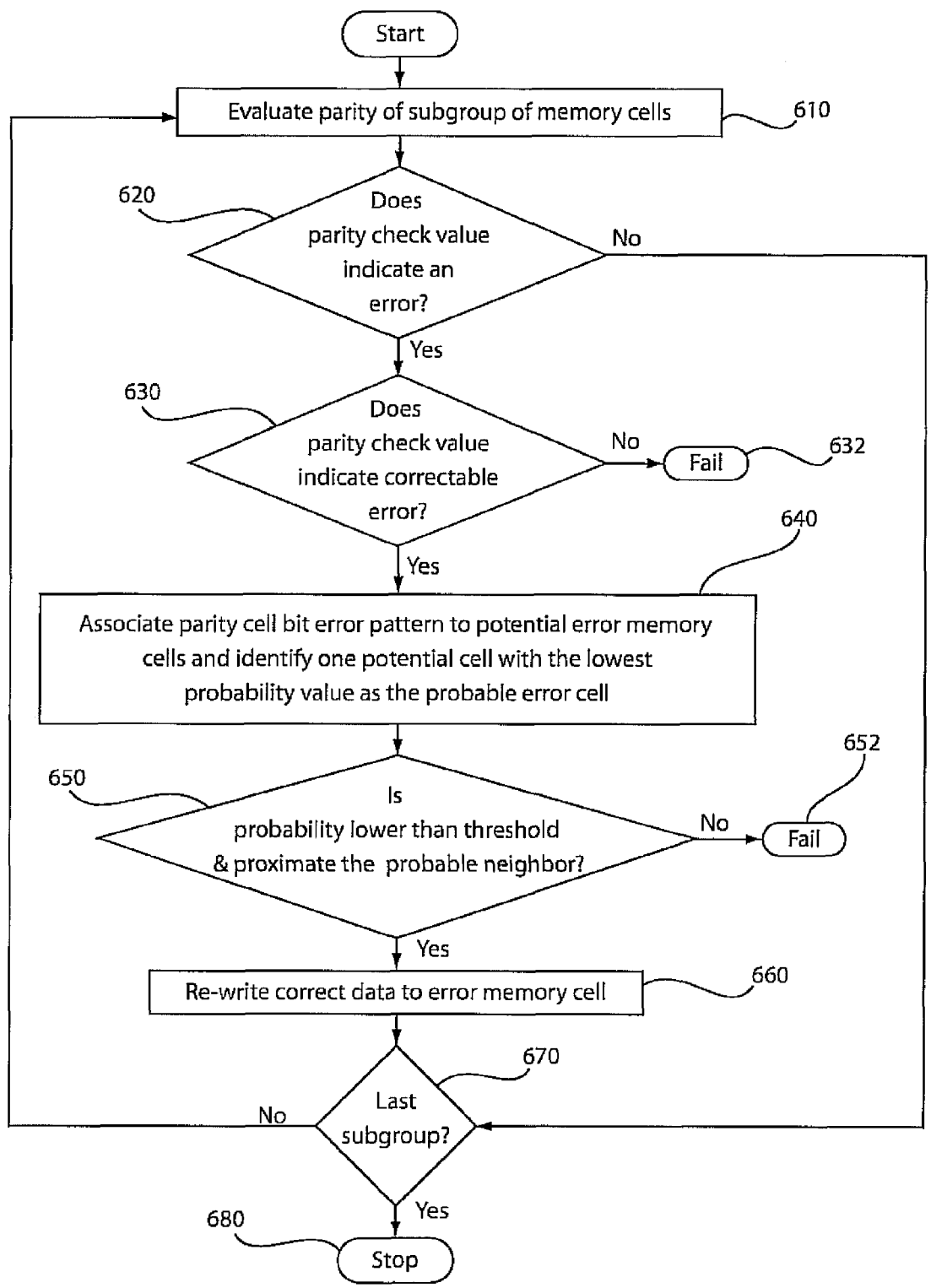
FIG. 10 is a block/flow diagram showing an error correction system/method for multi-level memory.

Referring to FIG. 10, an error detection and correction system/method is depicted in accordance with one embodiment. In block 610, a parity check is performed on a memory cell group in a memory cell collection. In block 620, a determination of whether an error is indicated in the parity check value is performed. If no error is encountered in block 620, the group is checked to determine if it is the last group in the memory cell collection in block 670. If an error is encountered in block 620, block 630 examines the parity check value for correctable and non-correctable errors. If the parity check indicates a non-correctable error, the operation is deemed to have failed in block 632 since the data is corrupted and no correction is possible.

If a correctable error is determined in block 630, the parity bit error pattern is associated to error memory cells that may have been misgrouped as a result of overlap in probability distributions in block 640. In addition, the cell with the lowest probability value is identified as the probable error cell. In block 650, a determination is made as to whether the probability of the error cell is less than a preset threshold amount, and a determination is made for a closest or proximate neighbor distribution which is the most probable neighboring distribution to which the error cell would belong.

If the probability does not meet the threshold or does not have a likely proximate neighbor in block 650, then the step fails in block 652. If the probability meets the threshold and has a likely proximate neighbor in block 650, then the correct data is rewritten to the error data cell to ensure that the appropriate information is stored in block 660.

In block 670, a determination is made as whether the last memory cell group in the memory cell collection has been processed. If it has, then the process ends in block 680. Otherwise, the process returns to block 610 and processes the next group of memory cells.

Figure 11:
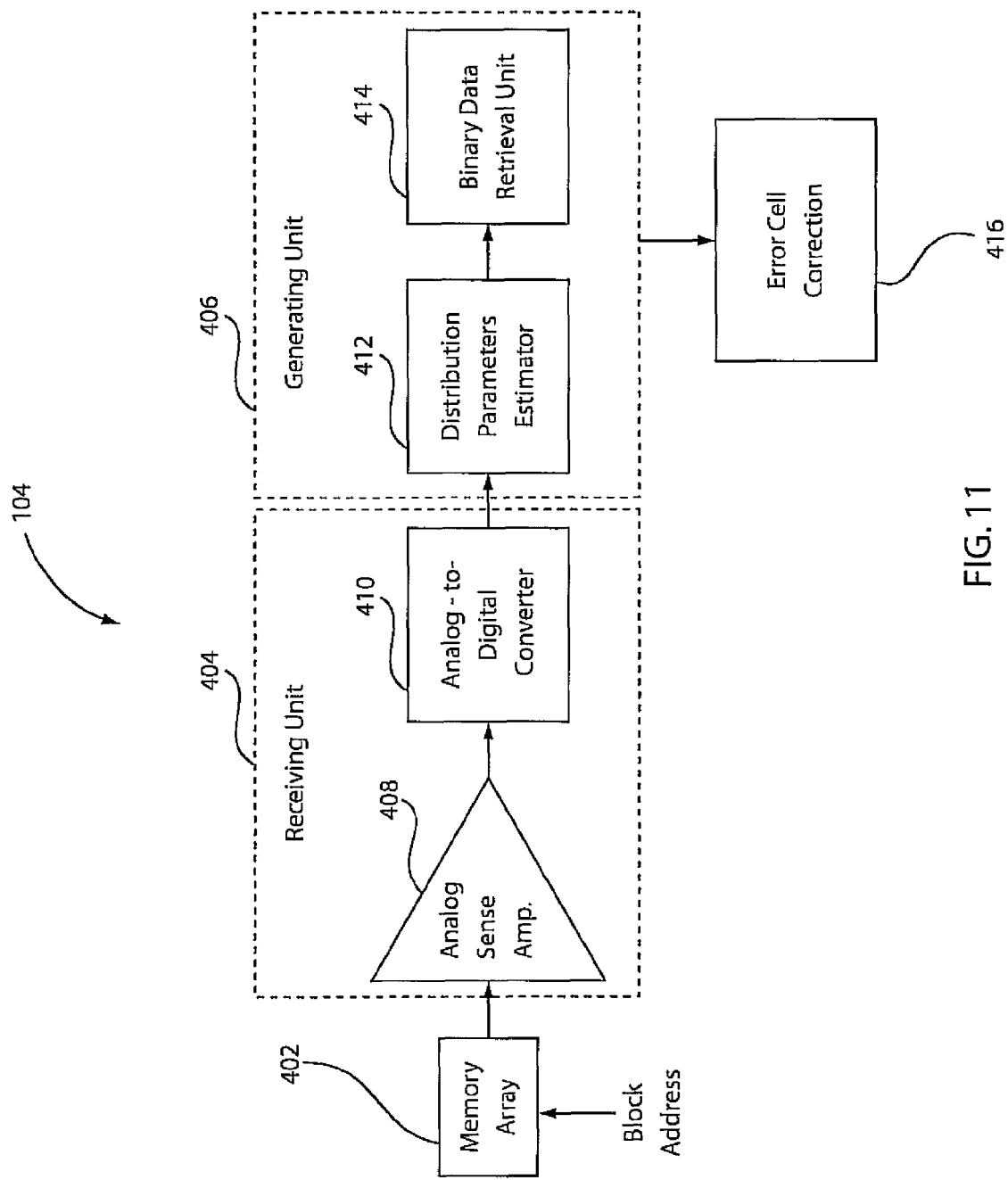
FIG. 11 illustrates a memory controller utilized for operation of a memory system in accordance with the present principles.

Referring to FIG. 11, in one illustrative embodiment, memory controller 104 includes a receiving unit 404 and a generating unit 406. The receiving unit 404 receives the values of the characteristic parameter for each memory cell in a memory array 402. The memory cells examined by the receiving unit 404 may, for example, be addressed using a block address input to the memory array 402. The generating unit 406 is coupled to the receiving unit 404 and is configured to generate a probability distribution function of the characteristic parameter for each of the possible binary values for a memory array 402.

More specifically, data is accessed by locating the block address of a memory array 402 including the data desired. The raw data is read as an analog signal by an analog sense amplifier 408. The analog sense amplifier 408 amplifies the signal and sends the signal to an analog-to-digital converter 410. The analog-to-digital converter 410 converts the analog signal to digital data that can be read and processed by the generating unit 406. In one embodiment, the resolution of the analog-digital converter 410 is a multiple of the number of bits stored in each memory cell. For example, the resolution of the analog-to-digital converter 410 may have a resolution three times the number of bits stored per memory cell. For a memory cell storing two bits, the resolution would therefore equal six bits.

A distribution parameters estimator 412 in the generating unit 406 creates the normal distribution curves for the memory block with the probability distribution function. The mean and variance of these distribution curves are also calculated by the distribution parameters estimator 412. A binary data retrieval unit 414, coupled to the parameters estimator 412, converts the value of the characteristic parameter for the target memory cell into a binary value for which the probability is highest.

An error correction unit 416 identifies error cells by determining whether a parity cell as sensed by sense amplifier 408 includes a wrong parity. In addition, unit 416 determines whether a probability of the lowest energy memory cell is below a threshold value for a given distribution. If an error cell is determined to exist, the unit 416 assigns the error cell to a nearest neighboring distribution. Thus, the error correction unit 416 assigns the stored data of the error cell to be in the correct distribution.

Having described preferred embodiments for multi-level memory error detection and correction systems and methods (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for operating a collection of memory cells, comprising:
    storing binary data values and parity data values by associating binary values with a common adjustable characteristic parameter of a memory cell collection;
    reading and constructing probability distribution functions for values of the characteristic parameter of the memory cell collection;
    retrieving binary data values and parity data values stored in the memory cell collection; and
    evaluating parity data for error detection and error correction in the binary data values.

2. The method as recited in claim 1, wherein one or more parity memory cells are included with the memory cells of the memory cell collection.

3. The method as recited in claim 1, wherein evaluating parity data includes identifying an erroneous memory cell by comparing probabilities of all the memory cells in the memory cell collection including the parity memory cell with their respective distributions and choosing a most probable erroneous memory cell based on a probability value.

4. The method as recited in claim 1, further comprising correcting an error memory cell by associating the characteristic parameter value of the memory cell to a nearest neighboring probability distribution.

5. The method as recited in claim 4, wherein the nearest neighboring probability distribution includes an adjacent probability distribution with a largest probable bias.

6. The method as recited in claim 1, wherein the probability distribution functions employ a maximum likelihood estimation.

7. The method as recited in claim 1, wherein evaluating parity data includes extracting a parity bit associated with a group of memory cells to determine if an error exists in the group.

8. The method as recited in claim 1, wherein the characteristic parameter is one of charge storage variation in a capacitor, threshold voltage variation in a floating gate, resistance variation and reflectivity variation of a phase change material.

9. A method for multi-level memory error detection and correction wherein each of a plurality of memory cells stores one or more bits of binary data associated with a characteristic parameter of the memory cells, comprising:
    evaluating parity data of a group of memory cells;
    whether errors based on the parity data are correctable;
    if correctable, probabilities that memory cells include an error by comparing binary values of the memory cells to distribution functions associated with a characteristic value;
    identifying a memory cell with a probable error based on the probabilities; and
    associating the memory cell with a neighboring distribution associated with a nearest proximate reference value to correct the error.

10. The method as recited in claim 9, wherein evaluating parity data of a group of memory cells includes grouping one or more parity memory cells with the memory cells of the memory cell collection.

11. The method as recited in claim 9, wherein identifying includes identifying an erroneous memory cell by comparing probabilities of all the memory cells in a memory cell collection including the parity memory cell with their respective distributions and choosing a most probable erroneous memory cell based on a probability value.

12. The method as recited in claim 9, further comprising correcting an error memory cell by associating the characteristic parameter value of the memory cell to a nearest neighboring probability distribution, wherein the nearest neighboring probability distribution includes an adjacent probability distribution with a largest probable bias.

13. The method as recited in claim 9, wherein the distribution functions employ a maximum likelihood estimation.

14. The method as recited in claim 9, wherein evaluating parity data includes extracting a parity bit associated with a group of memory cells to determine if an error exists in the group.

15. The method as recited in claim 9, wherein the characteristic parameter is one of charge storage variation in a capacitor, threshold voltage variation in a floating gate, resistance variation and reflectivity variation of a phase change material.

16. A memory device, comprising:
   memory cells organized in groups, each memory cell in the group storing at least one possible binary value delimited by value ranges of a characteristic parameter, each group including at least one parity memory cell for storing a parity indicator;
   a receiving unit for receiving the values of the characteristic parameter for each memory cell in the group;
   a generating unit for generating a probability distribution function of the characteristic parameter for each of the possible binary values for the group, the generating unit using the probability distribution function to determine the probable value range for the shifted value of the characteristic parameter of a target memory cell, and the generating unit converting the value of the characteristic parameter for the target memory cell into a binary value for which the probability is highest; and
   an error cell correction unit configured to identify cells not belonging to a distribution and assigning the error cell to a nearest neighboring distribution.

17. The memory device as recited claim 16, wherein the receiving unit includes an analog sense amplifier and converts the analog signals into digital signals representing the characteristic parameter.

18. The memory device as recited claim 16, wherein the probable value range of the shifted value of the characteristic parameter of the target memory cell is generated by a maximum likelihood estimator.

19. The memory device as recited claim 16, wherein the parity cell is located in the group of memory cells that the parity cell represents.

* * * * *